United States Patent
Batruni

(10) Patent No.: US 7,917,337 B2
(45) Date of Patent: Mar. 29, 2011

(54) ADAPTIVE SELF-LINEARIZATION WITH SEPARATION FILTER

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 0 days.

(21) Appl. No.: 11/728,725

(22) Filed: Mar. 26, 2007

(65) Prior Publication Data

US 2008/0082280 A1    Apr. 3, 2008

Related U.S. Application Data

(60) Provisional application No. 60/848,425, filed on Sep. 29, 2006.

(51) Int. Cl.
*H04B 10/18* (2006.01)
(52) U.S. Cl. ......... 702/190; 702/179; 702/182; 702/189
(58) Field of Classification Search .................. 702/86, 702/104, 126, 141, 183, 189; 341/118, 120; 455/91, 280; 375/240.11
See application file for complete search history.

(56) References Cited

U.S. PATENT DOCUMENTS

| | | | |
|---|---|---|---|
| 4,701,934 A | 10/1987 | Jasper | |
| 4,751,730 A | 6/1988 | Galand et al. | |
| 4,926,472 A | 5/1990 | Batruni | |
| 5,252,930 A | 10/1993 | Blauvelt | |
| 5,537,443 A | 7/1996 | Yoshino et al. | |
| 5,568,411 A | 10/1996 | Batruni | |
| 5,848,105 A | 12/1998 | Gardner et al. | |
| 5,864,754 A * | 1/1999 | Hotto | 455/280 |
| 6,377,116 B1 * | 4/2002 | Mattsson et al. | 330/2 |
| 6,388,513 B1 * | 5/2002 | Wright et al. | 330/2 |
| 6,577,731 B1 | 6/2003 | Sugiyama | |
| 6,798,843 B1 * | 9/2004 | Wright et al. | 375/296 |
| 6,856,191 B2 * | 2/2005 | Bartuni | 327/552 |
| 7,139,327 B2 * | 11/2006 | Vella-Coleiro et al. | 375/296 |
| 7,199,736 B2 * | 4/2007 | Batruni | 341/118 |
| 7,342,976 B2 | 3/2008 | McCallister | |
| 7,382,985 B2 * | 6/2008 | Roberts et al. | 398/159 |
| 2004/0027198 A1 | 2/2004 | Chandrasekaran et al. | |
| 2004/0156038 A1 | 8/2004 | Cao | |
| 2004/0164791 A1 | 8/2004 | Batruni | |
| 2004/0263367 A1 | 12/2004 | Batruni | |
| 2005/0219089 A1 | 10/2005 | Batruni | |
| 2005/0243946 A1 * | 11/2005 | Chung et al. | 375/297 |
| 2006/0093050 A1 | 5/2006 | Strait | |
| 2007/0286230 A1 | 12/2007 | Basu | |

OTHER PUBLICATIONS

Roy G. Batruni "Curling Nonlinear Distortion", Embedded Systems Design, Embedded.com, Aug. 16, 2006, (p. 1, para 4, 7)(p. 4, para 2); downloaded from the internet http://www.embedded.com/columns/technicalinsights/191801716?_requestid=210985 (downloaded on Feb. 26, 2006.).

* cited by examiner

*Primary Examiner* — Eliseo Ramos Feliciano
*Assistant Examiner* — Felix E Suarez
(74) *Attorney, Agent, or Firm* — Van Pelt, Yi & James LLP

(57) ABSTRACT

Signal processing includes receiving an unknown signal having a distorted component and an undistorted component, the distorted component and the undistorted component having a nonlinear relationship; and separating from the unknown signal a reference component and a target component.

22 Claims, 13 Drawing Sheets

ADAPTIVE SELF-LINEARIZATION WITH SEPARATION FILTER

CROSS REFERENCE TO OTHER APPLICATIONS

This application claims priority to U.S. Provisional Patent Application No. 60/848,425, entitled ADAPTIVE SELF-LINEARIZATION: FULL SYSTEM OPERATION AND ARCHITECTURE, filed Sep. 29, 2006 which is incorporated herein by reference for all purposes.

BACKGROUND OF THE INVENTION

Nonlinearity is a problem present in many signal processing systems. For example, the channel and the devices can introduce nonlinearity to a transmitted signal, thus causing distortion in the output. A typical way of correcting the nonlinearity is by using a training signal with known signal characteristics such as amplitude, phase, frequency, data sequence, and modulation scheme. The nonlinearities in the system will introduce distortion. The received signal is a composite signal of a distorted component, and an undistorted component that corresponds to the ideal, undistorted training signal. During a training period, the training signal is available to the receiver. Filters in the receiver's signal processor are adjusted until the output matches the training signal. This training technique requires that the ideal, undistorted training signal be available during the training period. The technique is sometimes impractical since adding the training to the manufacturing process will increase the cost of the device. Further, system nonlinearities may vary due to factors such as variations in signal paths, power supply, temperature, signal dynamics, Nyquist zone of the signal, and/or aging of components. It is, however, often impractical to re-train the device since the undistorted training signal may no longer be available. It would be desirable, therefore, to be able to more easily compensate for system nonlinearity. It would also be useful if the solution would not significantly increase the cost of manufacturing the device.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Signal separation and linearization is described. In some embodiments, based on an unknown distorted signal that is received, a reference component and a target component are separated from the unknown signal. Based on the separation, self-linearization is performed to compensate for nonlinear distortion and obtain an output signal that is substantially undistorted. As used herein, linearization refers to removing or compensating the nonlinearities in a signal. Self-linearization refers to calibration/linearization that does not require a training signal whose specific characteristics (such as frequency components, amplitudes, phases, data sequence, and/or modulation scheme) are already known to the module receiving the signal.

Figure 1A:
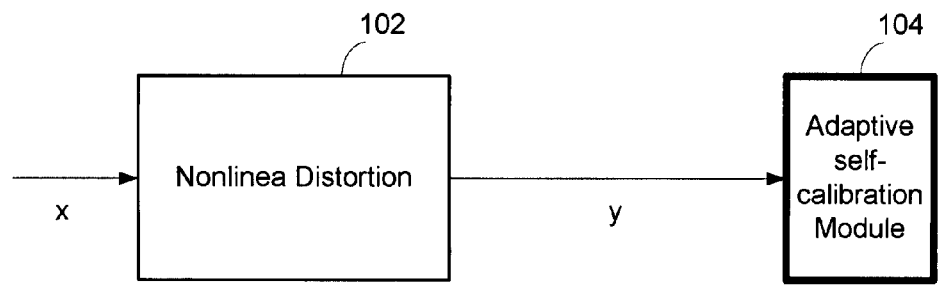
FIG. 1A is a system diagram illustrating an embodiment of a system that includes an adaptive self-linearization module.

FIG. 1A is a system diagram illustrating an embodiment of a system that includes an adaptive self-linearization module. An unknown input signal x is distorted by block 102, generating a distorted signal y. Block 102 represents nonlinear distortion introduced by the transmission media, electronic circuits, or any other source. An adaptive self-linearization module 102 is configured to correct for the distortion based on the received signal y.

Figure 1B:
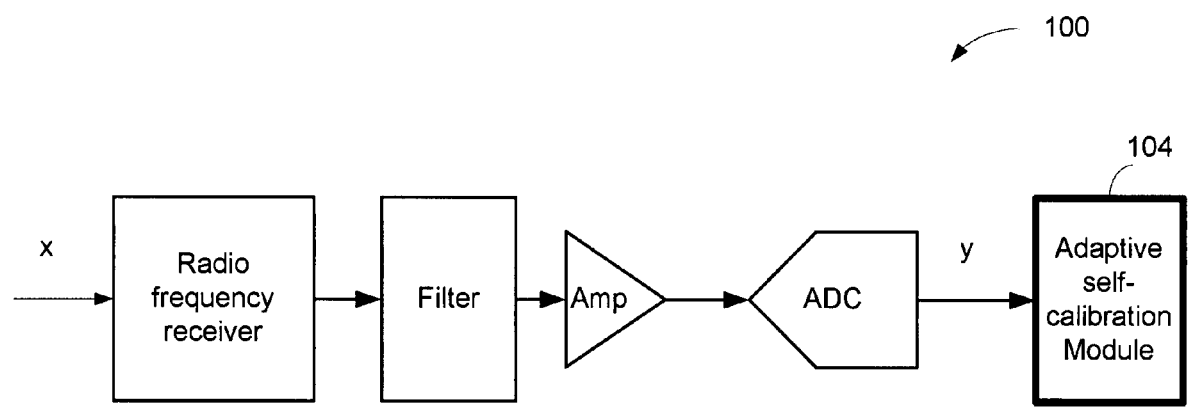
FIG. 1B is a system diagram illustrating an embodiment of a wireless receiver that includes an adaptive self-linearization module.

FIG. 1B is a system diagram illustrating an embodiment of a wireless receiver that includes an adaptive self-linearization module. The system is used to illustrate one application of the adaptive self-linearization module, although many other applications and configurations exist. In the example shown, system 100 is a receiver. The system has a number of components including a radio frequency receiver, a filter, an amplifier, an analog to digital converter. Each of the components has some nonlinear characteristics, causing nonlinear distortion to the input signal. An adaptive self-linearization module 104 is configured to correct for nonlinearities in the receiver electronics, as well as the nonlinearities in the transmission channel. The adaptive self-linearization module can also be used to correct nonlinearities in other systems where an input signal is distorted by nonlinearity introduced by device components and/or transmission media. For example, the adaptive self-linearization module is sometimes included in transmitters, amplifiers, analog to digital converters, and many other types of electronic circuits to correct for system nonlinearities.

Figure 2:
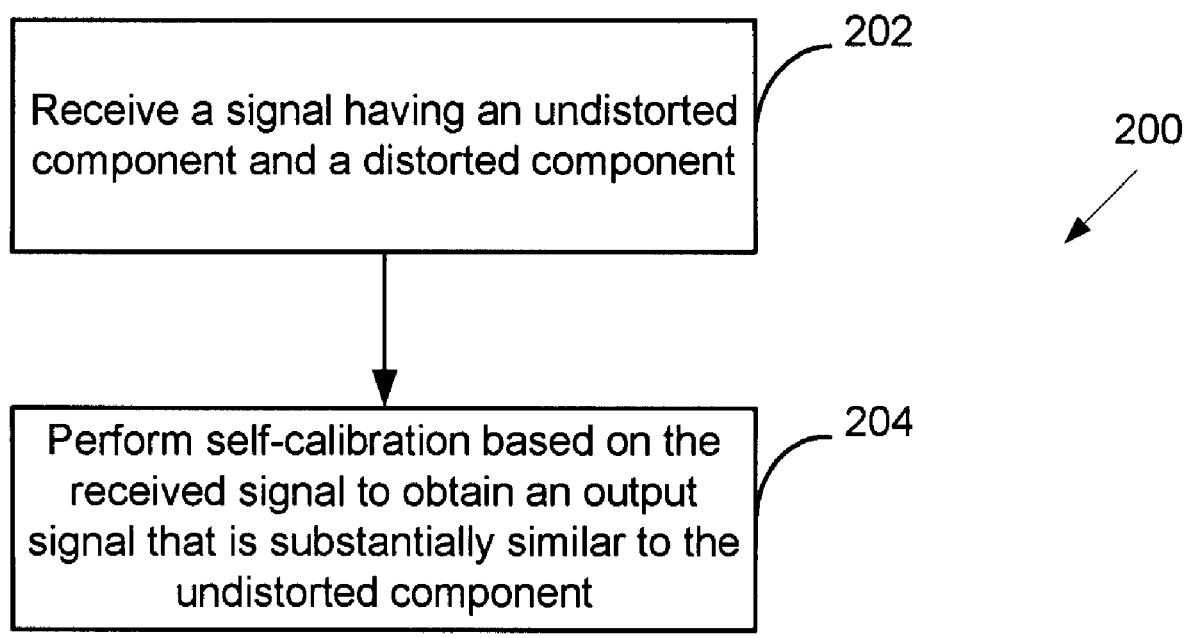
FIG. 2 is a flowchart illustrating an embodiment of a signal processing process.

FIG. 2 is a flowchart illustrating an embodiment of a signal processing process. Process 200 may be implemented on adaptive self-linearization module 102 of system 100. The process initiates when an unknown signal having an undistorted, ideal component and a distorted component is received (202). The signal is said to be unknown with respect to the receiver of the signal since specific characteristics that define the undistorted component of the signal, such as amplitude, phase, signal frequency, data sequence, or modulation scheme are not necessarily available to the receiver. In other words, the receiver does not necessarily have direct access to the undistorted component, nor is the receiver necessarily able to reproduce the undistorted component without further linearization. Self-linearization, sometimes also referred to as blind linearization, is performed based on the received signal to obtain an output signal that is substantially similar to the undistorted component (204). A training signal with known signal characteristics is not required. Thus, the nonlinearities in the system can be corrected while the system is operating in the field. The linearization can be done in real time since it requires no more than a few hundred milliseconds from the time an unknown signal is received. The nonlinear characteristics of the system may change during operation due to nonlinearity causing factors such as variations in the signal source, the paths, the power supply, temperature, signal dynamics, Nyquist zone of the signal, sampling frequency, aging of components, component value tolerances, etc. The adaptive self-linearization module can repeatedly or continuously adapt to correct the nonlinearities despite changes in any of these factors. Further, the operation of the adaptive self-linearization module is independent of the modulation scheme or encoding scheme of the received signal.

Figure 3A:
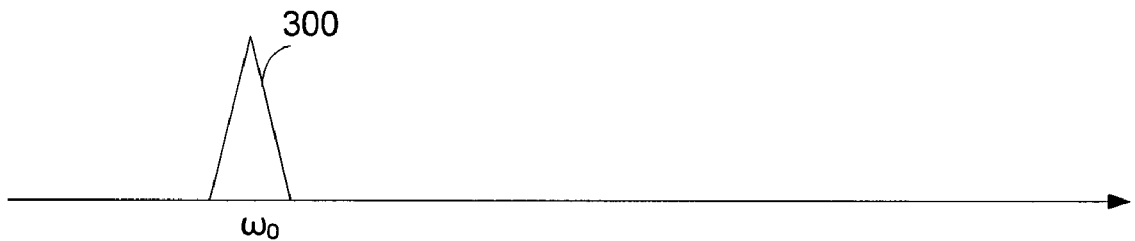
FIGS. 3A-3C are frequency domain signal spectrum diagrams illustrating an example of nonlinear distortion in a signal.
Figure 3B:
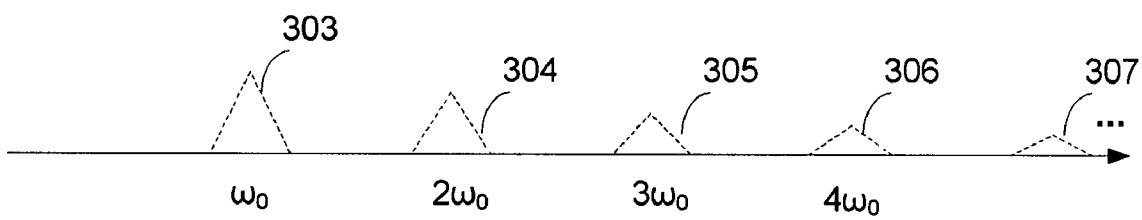
Figure 3C:
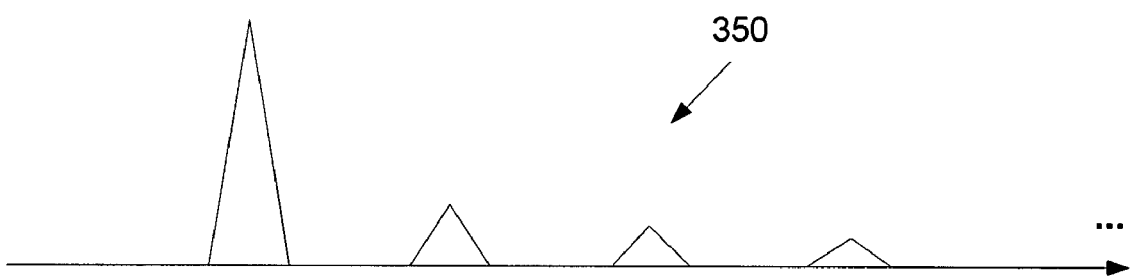

FIGS. 3A-3C are frequency domain signal spectrum diagrams illustrating an example of nonlinear distortion in a signal. In FIG. 3A, signal 300 is an ideal, undistorted signal x centered at $\omega_0$. Nonlinear characteristics of the system lead to distorted components, which are shown in FIG. 3B. The distorted components occur at integer multiples of center frequency $\omega_0$. The resulting signal to be received and processed by the adaptive self-linearization module is shown in FIG. 3C.

It is assumed that the distortion signal can be expressed using a Taylor series. Even harmonics such as 304 and 306 are caused by distortion terms that are even powers of the signal ($x^2$, $x^4$, etc.). The even harmonics are relatively easy to remove since they are outside the fundamental frequency band of the desired signal. Odd harmonics such as 303, 305, and 307 are caused by distortion terms that are odd powers of the signal ($x^3$, $x^5$, etc.). It is more difficult to remove the odd harmonics since harmonic 303 lies within the fundamental frequency band of the desired signal. As will be shown in more detail below, the adaptive self-linearization module is able to approximately produce the distorted components, thereby approximately determine the ideal, undistorted signal 300. Adaptive self-linearization can be performed based on an unknown signal received while the device is operating (as opposed to using a known training signal). Further, an adaptive self-linearization module allows the device to be calibrated regardless of variations in the nonlinearity causing factors.

Figure 4A:
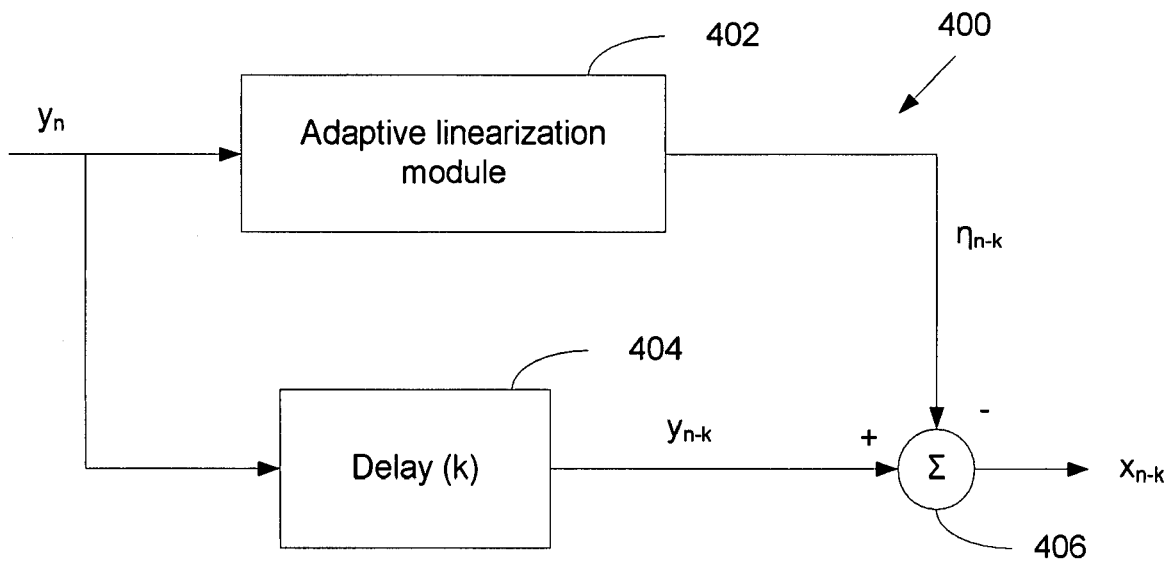
FIG. 4A is a diagram illustrating an embodiment of an adaptive self-linearization module.

FIG. 4A is a diagram illustrating an embodiment of an adaptive self-linearization module. In the example shown, module 400 includes an adaptive linearization module 402 and a delay component 404. Based on its input $y_n$, the adaptive linearization module configures its internal filters to generate an output that approximates the distorted component. Since the adaptation process leads to a delay of k samples in the output, the output is denoted as $\eta_{n-k}$. Details of how the adaptation is made are described below. $y_n$ is sent to a delay module to obtain a delayed version, $y_{n-k}$. Combiner 406 combines $\eta_{n-k}$ from $y_{n-k}$ to obtain the desired, linearized signal component $x_n$. As used herein, combining may be addition or subtraction.

Figure 5A:
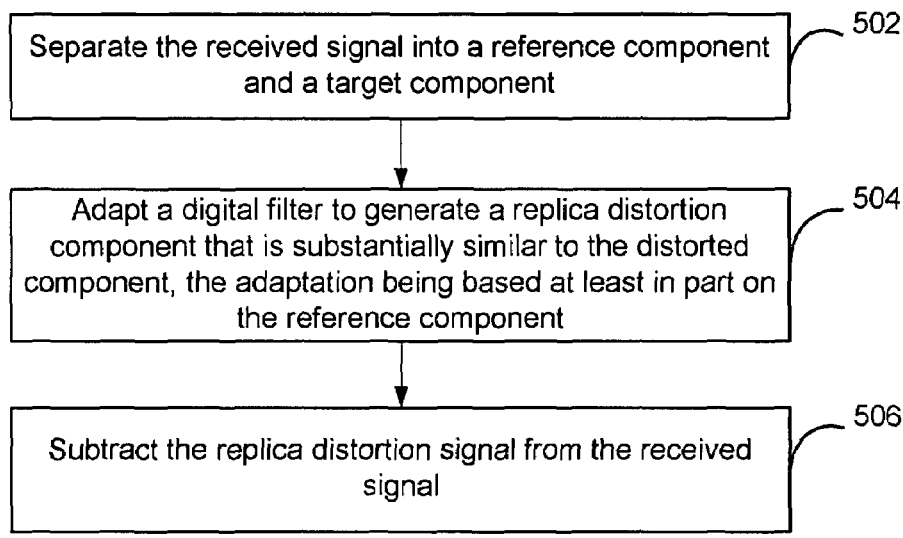
FIG. 5A is a flowchart depicting an embodiment of an adaptive self-linearization process.

FIG. 5A is a flowchart depicting an embodiment of an adaptive self-linearization process. Process 500 shown in the example may be implemented on an adaptive self-linearization module such as 400. During the process, an unknown distorted signal is separated into a reference component and a target component (502). The reference component, sometimes referred to as the offending signal, includes an estimate of one or more signal components that cause the nonlinear distortion in the unknown distorted signal. In some embodiments, the reference component includes an aggregated version of the undistorted component as well as the harmonics within the frequency band of the undistorted component. The harmonics are relatively small and their effects can be ignored for practical purposes. In some embodiments, the reference component includes one or more noise signals in a frequency band separate from that of the desired signal. The target component is the difference between the input signal and the reference component. A digital filter is adapted to generate a replica distortion signal that is substantially similar to the distorted component. The adaptation is based at least in part on the reference component and the target component (504). By separating the reference and target components, the system can train its filter based on a received signal whose characteristics are not known prior to the training. The replica distortion signal is subtracted from the unknown distorted signal to generate the distortion corrected output (506).

Figure 6:
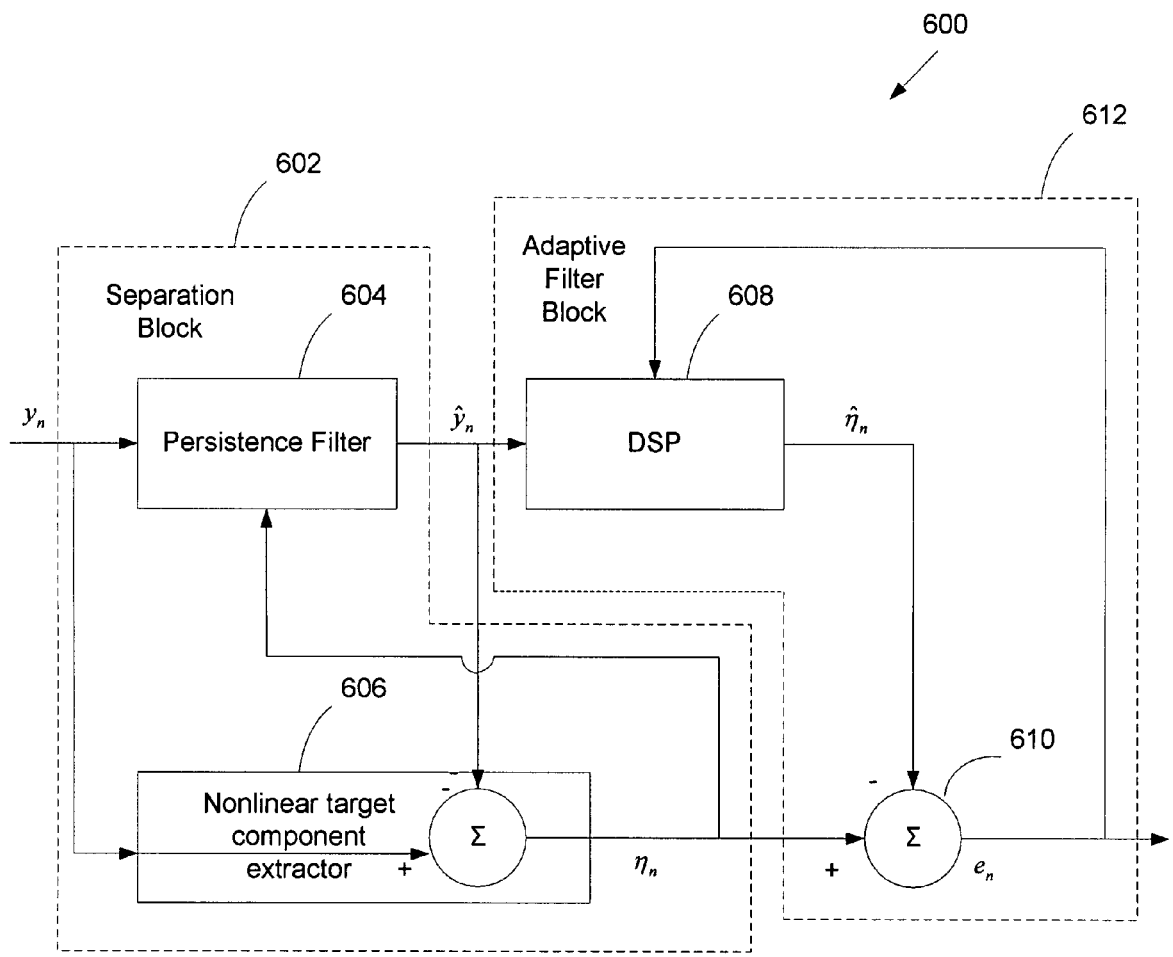
FIG. 6 is a diagram illustrating details of an embodiment of an adaptive linearization module.

FIG. 6 is a diagram illustrating details of an embodiment of an adaptive linearization module. In the example shown, system 600 includes a separation block 602 and an adaptive filter block 612. $y_n$ is a received signal with distortion. The signal is sent to separation block 602, which includes a persistence filter 604 and a nonlinear signal extractor 605. As will be shown in more detail below, the separation block is configured to extract from the input signal $y_n$ a reference component $\hat{y}_n$. In this example, $\hat{y}_n$ is a linearly enhanced version of the input signal. The target component $\eta$ is a function of the received signal and its history. At each time instance, $\eta_n$ is expressed as $y_n - \hat{y}_n$.

For example, let the received signal $y_n = 1.001 x_n^3 + 0.01 x_n^3$ where $x_n$ is the desired undistorted component, and $0.001 x_n + 0.01 x_n^3$ is the distorted component. A properly configured separation filter will produce a reference component $\hat{y}_n$ that is approximately $kx_n$ (k being a value close to 1), and a target component $\eta_n$ that is $y_n - kx_n$.

In some embodiments, the nonlinear signal extractor further includes a delay element to give the input the same amount of delay as the separation filter. In some embodiments, the nonlinear signal extractor optionally includes a band pass filter, a low pass filter, or a high pass filter. The additional filter is appropriate, for example, in applications where the frequency band of the reference component is known.

Returning to FIG. 6, $\hat{y}_n$ and $\eta_n$ are both sent to an adaptive filter block 612, which includes an adaptive nonlinear digital signal processor (DSP) 608. The adaptive nonlinear DSP is sometimes implemented using an adaptive nonlinear filter. DSP 608 may be implemented using any suitable techniques, such as techniques described in U.S. Pat. No. 6,856,191 by Batruni entitled "NONLINEAR FILTER" and U.S. Pat. No. 6,999,510 by Batruni entitled "NONLINEAR INVERSION", both of which are herein incorporated by reference for all purposes. The patents incorporated by reference describe techniques for building nonlinear filters using linear elements, and for adapting such nonlinear filters to achieve desired transfer characteristics.

The DSP's inputs include the reference component $\hat{y}_n$ and a feedback error signal $e_n$ that is the difference between the target component $\eta_n$ and the DSP's output $\hat{\eta}_n$. The DSP is configured to use $\hat{y}_n$ as its input and $\eta_n$ as its training signal to adapt its filter coefficients and drive the error signal to a predetermined level. The filter coefficients of the DSP's digital filters may be adapted using adaptive techniques including Least Mean Squares (LMS), Recursive Least Squares (RLS), or any other suitable adaptive techniques. The DSP adapts to implement a filter having a transfer function that is approximately the same as the nonlinear transfer function of the system, so that eventually the DSP's output $\hat{\eta}_n$ is about the same as $\eta_n$. In other words, the DSP's adapted transfer function approximately corresponds to the transfer function representing the relationship of the distorted component with respect to the undistorted component. Assuming that the distorted component at the fundamental frequency is relatively small (e.g., $0.001 x_n$ as in the example discussed above), its effect is negligible and therefore is for all practical purposes ignored. In the above example, DSP 608 will adapt its filter parameters such that a transfer function of approximately $0.01 x_n^3$ is obtained.

In the embodiment shown, the error signal of the DSP is expressed as:

$$e_n = \eta_n - W_n^T \hat{Y}_n \quad (1)$$

where $W_n^T = [w_n \, w_{n-1} \, \ldots \, w_{n-N+1} \, w_{n-N}]$ are the nonlinear coefficients and $\hat{Y}_n^T = [\hat{y}_n \hat{y}_{n-1} \ldots \hat{y}_{n-N+1} \hat{y}_{n-N}]$ is the nonlinear filter's input vector.

The nonlinear coefficients are expressed using the following general form:

$$w_n = a_n \hat{y}_n + b_n + \sum_{j=1}^{K} c_{j,n} \left| A_{j,n}^T \hat{Y}_n + \beta_{j,n} \right| \quad (2)$$

$$= a_n \hat{y}_n + b_n + \sum_{j=1}^{K} c_{j,n} (A_{j,n}^T \hat{Y}_n + \beta_{j,n}) \lambda_{j,n}$$

where $$\lambda_{j,n} = \text{sign}(A_{j,n}^T \hat{Y}_n + \beta_{j,n}) \quad (3)$$

$$\hat{Y}_n = [\hat{y}_{n+M} \hat{y}_{n+M-1} \ldots \hat{y}_n \ldots \hat{y}_{n-M+1} \hat{y}_{n-M}] \quad (4)$$

$$A_{j,n}^T = [\alpha_{M,n} \alpha_{M-1,n} \ldots \alpha_{0,n} \ldots \alpha_{-M+1,n} \alpha_{-M,n}] \quad (5)$$

The coefficients have a time index n because the filter is adaptive and therefore time-varying. The nonlinear coefficients are adapted as follows:

$$A_{j,n+1}^T = A_{j,n}^T + \mu c_{j,n} \lambda_{j,n} \hat{Y}_n e_n \hat{y}_n \quad (6)$$

$$\beta_{j,n+1} = \beta_{j,n} + \mu c_{j,n} \lambda_{j,n} e_n \hat{y}_n \quad (7)$$

$$c_{j,n+1} = c_{j,n} + \mu |A_{j,n}^T \hat{Y}_n + \beta_{j,n}| e_n \hat{y}_n \quad (8)$$

$$a_{j,n+1} = a_{j,n} + \mu \hat{y}_n e_n \hat{y}_n \quad (9)$$

$$b_{j,n+1} = b_{j,n} + \mu e_n \hat{y}_n \quad (10)$$

Returning to FIG. 6, separation block 602 employs persistence filter 604 for separating the reference component from the received signal. The persistence filter is designed to boost the linear signal components and attenuate the noise and nonlinear signal components in the received signal. An analogy to the persistence filter is a camera shutter, which allows light to pass for a period of time in order to capture the stationary image. The background images that are non-stationary over this period of time become blurry. Like a camera shutter, over a period of time, the persistence filter captures the persistent portion of an input signal and removes the non-persistent portion. The persistence filter operates on pseudo stationary input signals that are not rapidly changing (for example, a signal that is stationary for at least a few milliseconds). For a pseudo stationary input signal, the persistent portion is the average of the desired reference component, which is relatively stable and enhances over time. In some embodiments, the persistence filter is designed as an averaging, linear filter that emphasizes the undistorted signal over noise, and emphasizes linear signal components over nonlinear distortion.

Figure 7:
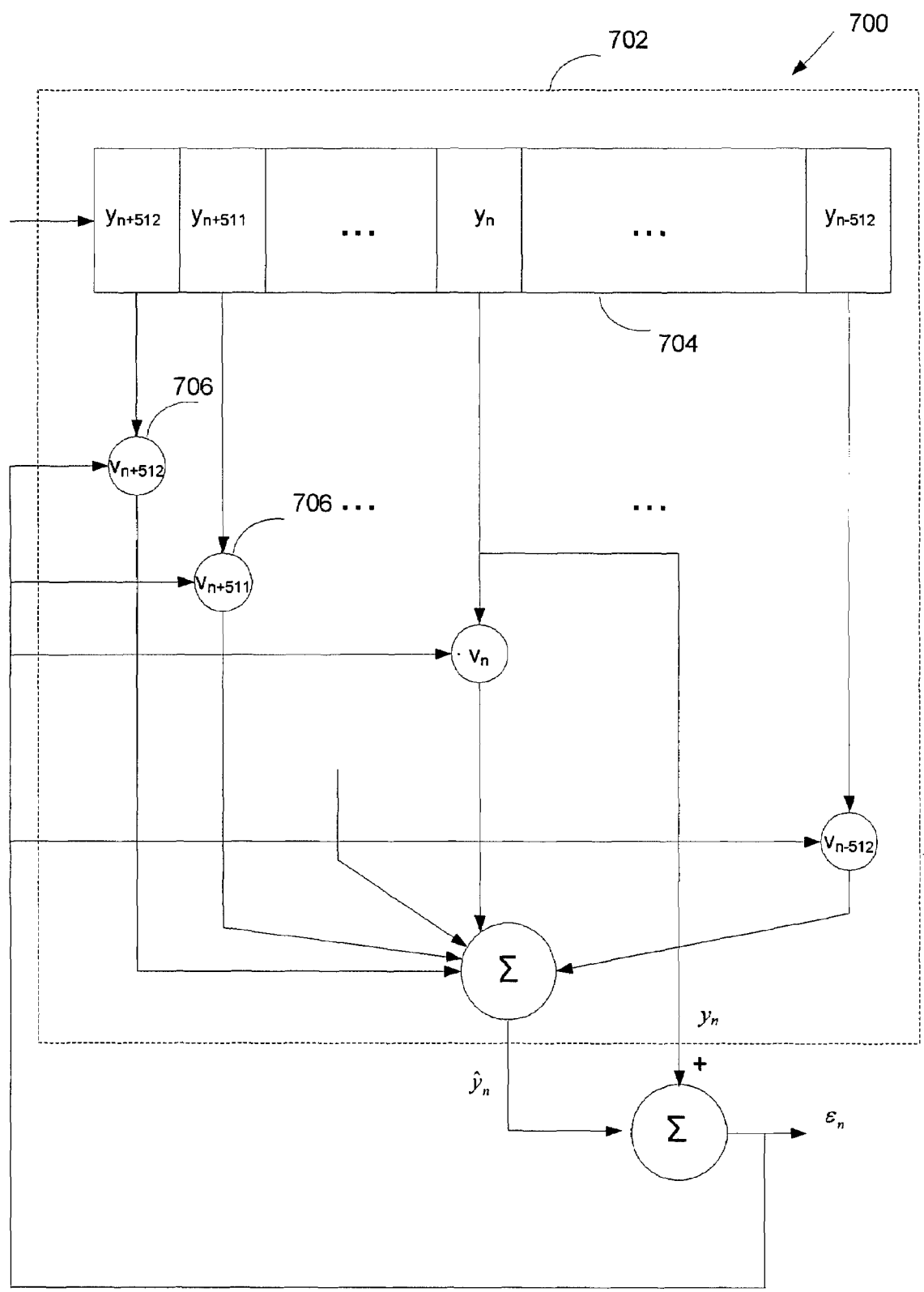
FIG. 7 is a diagram illustrating an embodiment of a separation block.

FIG. 7 is a diagram illustrating an embodiment of a separation block. In this example, separation block 700 includes a persistence filter 702, which includes a delay line 704 to which the input $y_n$ is sent, and a plurality of coefficient multipliers 706. The number of taps in the delay line is represented as $N = 2K + 1$. In the example shown, $K = 512$, which means that the delay line has 1025 taps for delays of 0, 1, 2, ... 1024. Each $y_i$ ($i = n+512, n+511, \ldots, n, \ldots n-511, n-512$) is scaled by multiplying with an adaptable coefficient $v_i$. The multiplication results are summed, producing the linear reference component $\hat{y}_n$. The center tap value $y_n$ is selected, and $\hat{y}_n$ is subtracted from $y_n$ to produce an error $\epsilon_n$. In this case, $\epsilon_n$ corresponds to target $\eta_n$. The error is fed back to update coefficients $v_i$. An adaptive algorithm such as LMS or RLS is used to update the coefficients until $\epsilon_n$ approaches some predefined threshold value. The separation block is configured to receive the input $y_n$ and aggregate $y_n$ over a period of time to produce an aggregate signal that is substantially similar to the undistorted component. The aggregate signal is considered substantially similar when $\epsilon_n$ meets some predefined threshold value. The aggregate signal is then subtracted from the received input.

Figure 8:
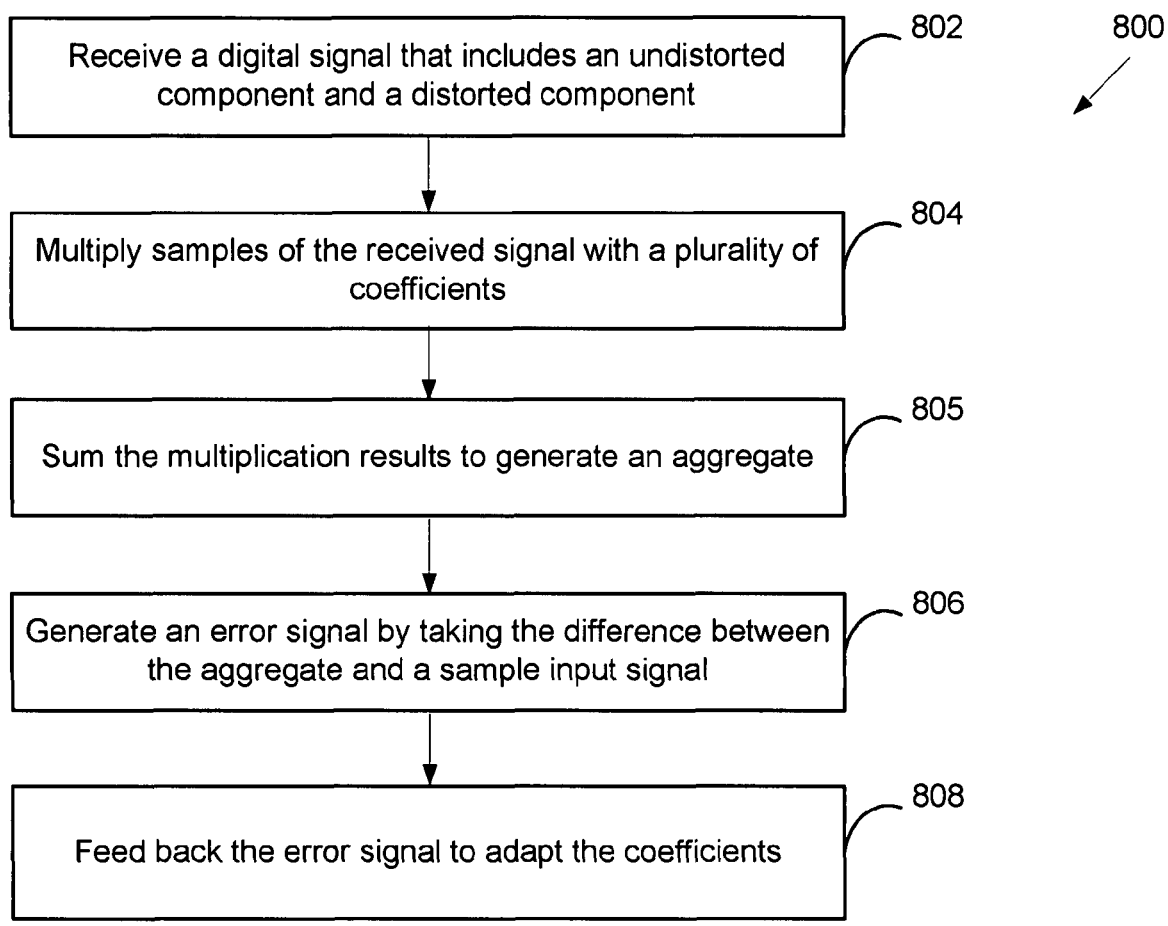
FIG. 8 is a flowchart illustrating an embodiment of a process for extracting an undistorted component from a distorted signal.

FIG. 8 is a flowchart illustrating an embodiment of a process for extracting an undistorted component from a distorted signal. Process 800 may be implemented on a separation block, such as 700 shown in FIG. 7. In this example, during the process, a digital signal that includes an undistorted component and a distorted component is received (802). A plurality of samples of the received signal are multiplied with a plurality of coefficients (804). The multiplication results are summed to produce an aggregate (805). The aggregate enhances the undistorted component and attenuates the distorted component. An error is generated by taking the difference between the aggregate and a sample of the received signal (806). The error is fed back to adapt the coefficients (808).

The persistence filter can be described using the following functions:

$$\eta_n = y_n - V_n Y_n \tag{11}$$

$$\eta_n = y_n - \hat{y}_n \tag{12}$$

$$V_{n+1} = \nu V_n + \mu \eta_n Y_n \tag{13}$$

where $Y_n = [y_{n+K} \ y_{n+K-1} \cdots y_n \cdots y_{n-K-1} \ y_{n-K}]$, $\mu$ is the adaptation step size that controls the persistency factor of the filter and $\nu$ is the forgetting factor that controls the speed with which the filter adapts to changing signal dynamics.

Figure 9:
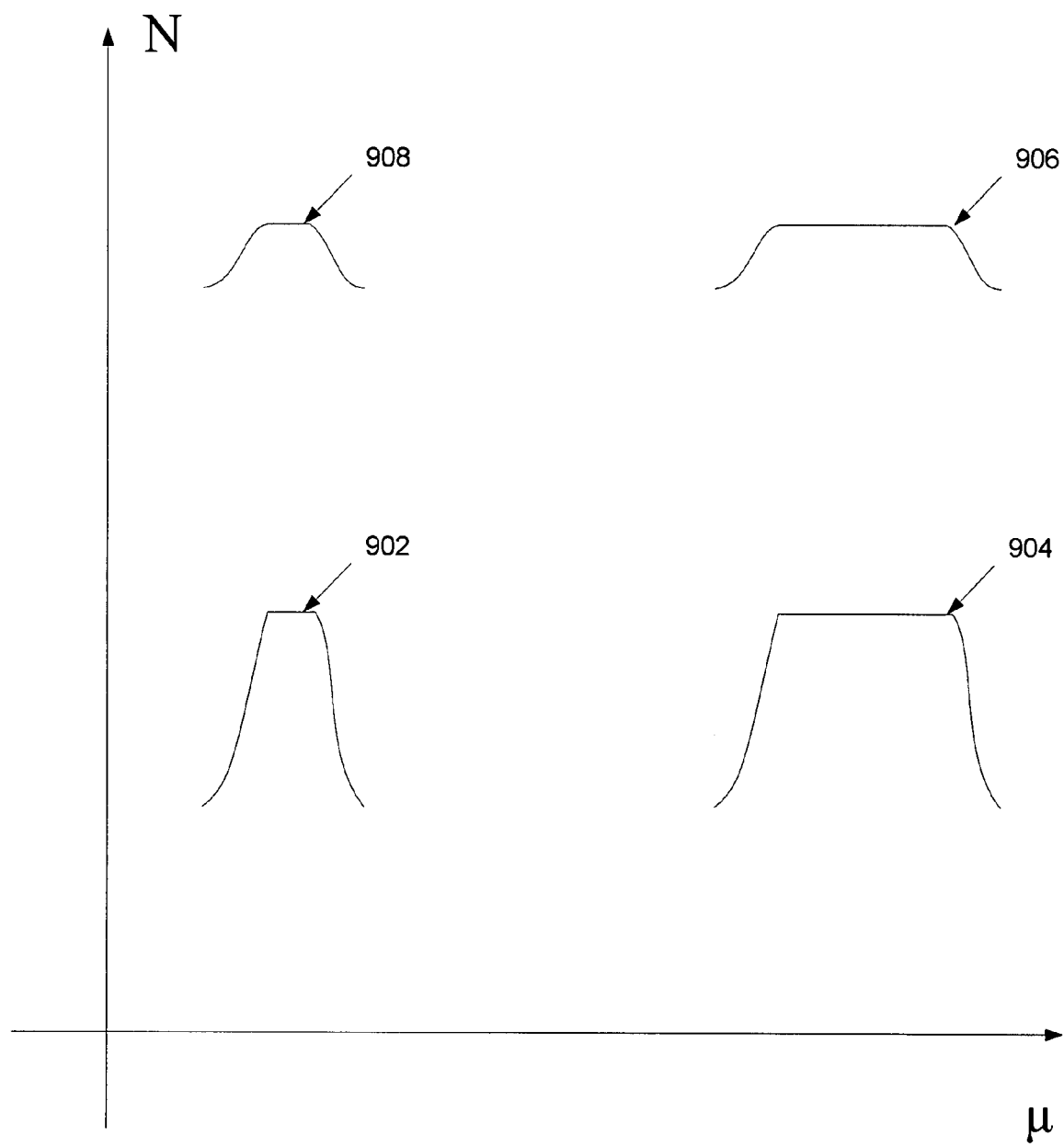
FIG. 9 is a diagram illustrating the relative relationship of step size $\mu$, number of taps N, and the type of linear component that can be effectively extracted.

The number of filter taps N (also referred to as the order of the filter) and the adaptive step size $\mu$ control the persistence filter's operations. A given filter order and step size combination may be particularly effective for emphasizing the received signal's linear component within a certain range of bandwidth and amplitude. FIG. 9 is a diagram illustrating the relative relationship of step size $\mu$, number of taps N, and the type of linear component that can be effectively extracted. The diagram informs the choice of $\mu$ and N. Generally, a higher N (i.e., a greater number of filter taps) should be used as the amplitude of the linear component goes down, and a smaller $\mu$ (i.e., a smaller step size) should be used as the bandwidth of the linear component goes down. As shown in the diagram, if the linear component has a relatively large amplitude and a relatively narrow bandwidth (such as signal 902), a persistence filter with a small $\mu$ and a small N produces good results. A linear component having a similarly large amplitude but a wider bandwidth (signal 904) requires a relatively small N and allows a greater $\mu$. A small amplitude and large bandwidth linear component (signal 906) requires a large N and a large $\mu$. A small amplitude and narrow bandwidth linear component (signal 908) requires a small $\mu$ and a large N. During operation, N and $\mu$ can be adjusted to more effectively generate the emphasized linear component. For example, in some embodiments, a peak detector and a power level detector are used to detect the strength of the signal. The signal strength is a function of the signal's peak and bandwidth. Based on the detected signal strength, appropriate adjustments to N and $\mu$ are made according to system requirements to control the adaptation.

Figure 4B:
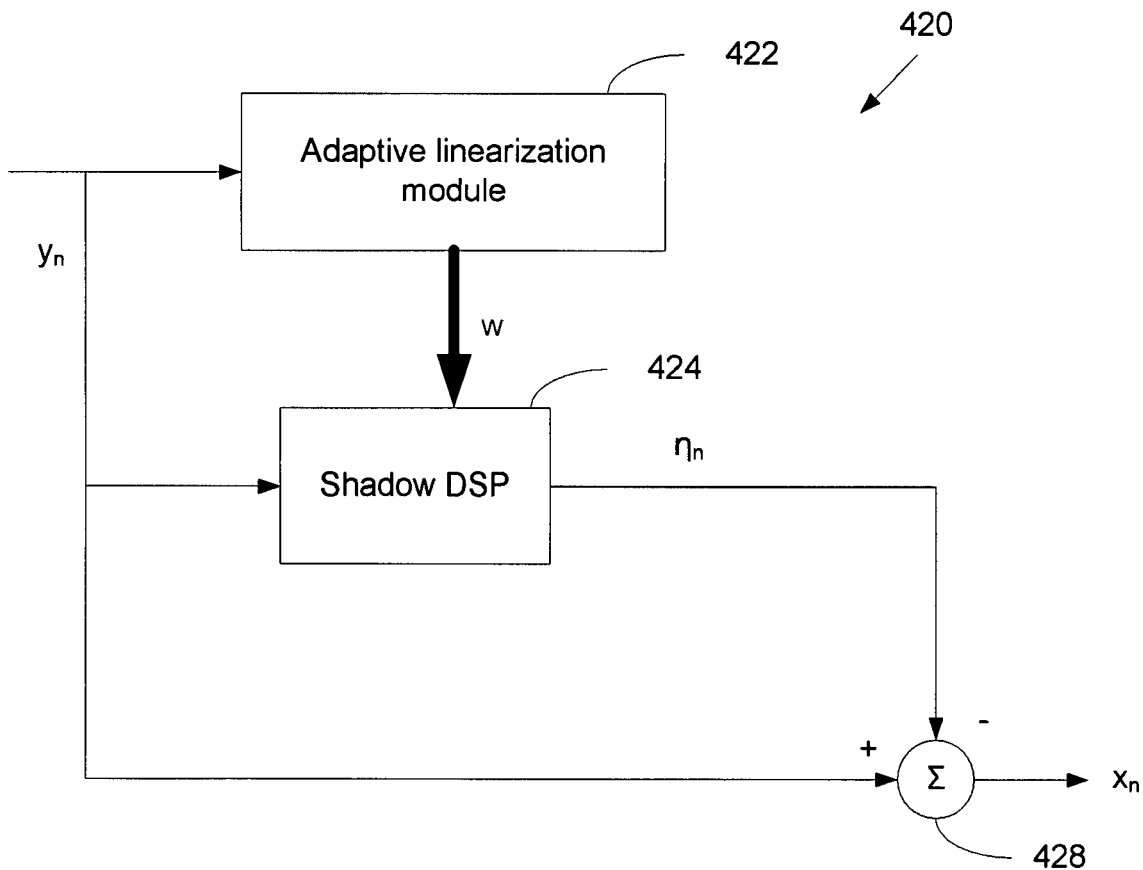
FIG. 4B is a diagram illustrating an embodiment of a low latency adaptive self-linearization system.

In some embodiments, the linearization process requires a large number of samples. The delay k sometimes corresponds to hundreds or even thousands of samples, resulting in delay on the order of tens or even hundreds of milliseconds. Some applications (e.g. telecommunication applications) may require the linearization process to have a lower latency. FIG. 4B is a diagram illustrating an embodiment of a low latency adaptive self-linearization system. In the example shown, system 420 is configured to have much lower latency than system 400. The DSPs shown in the system may be implemented as general or special purpose processors, or configurable filters. Adaptive linearization module 422 configures an internal DSP to simulate the nonlinear transfer function to be corrected and produces an output that is approximately equal to the nonlinear residual signal. As discussed above, assuming that the distortion within the fundamental frequency band is relatively small, a successfully adapted and configured DSP will have a transfer function that is approximately equal to the nonlinear transfer function to be corrected. The linearization module outputs the configuration parameters, w, to a shadow nonlinear DSP 424, which uses the parameters to configure its filters and duplicate the transfer function of the DSP employed by the adaptive linearization module. DSP 424's latency L is on the order of a few milliseconds, which is significantly smaller than the delay due to adaptation k. As such, system 420 has significantly less delay than system 400.

Figure 5B:
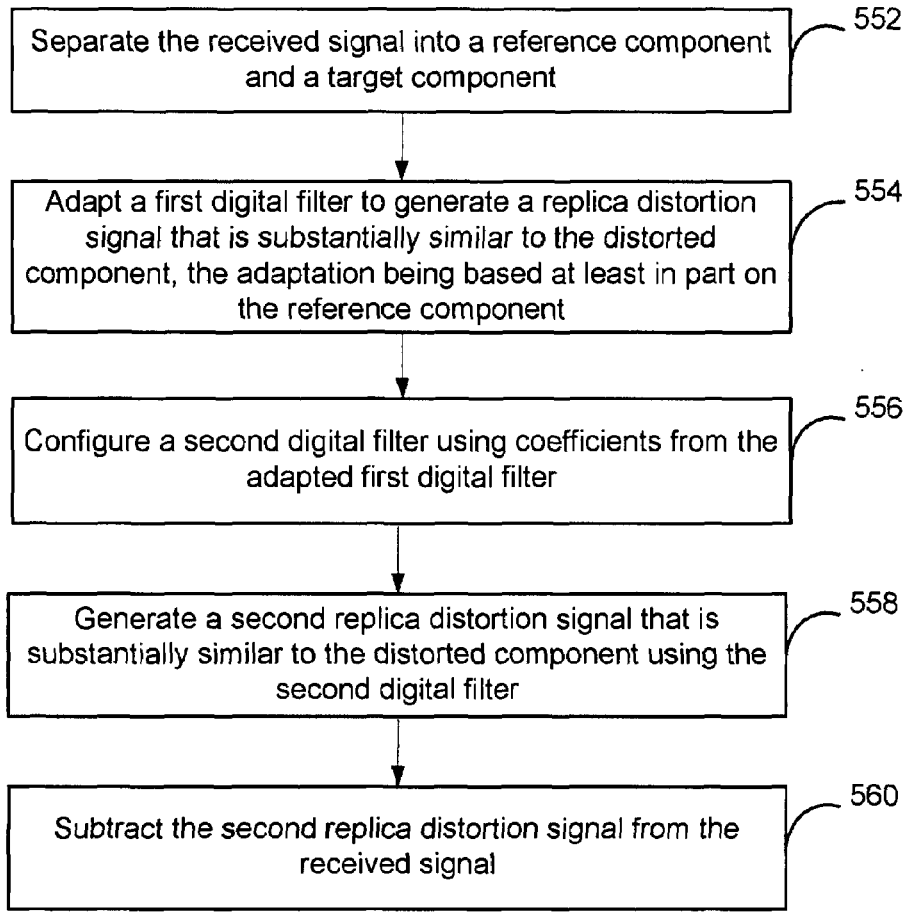
FIG. 5B is a flowchart illustrating another embodiment of an adaptive self-linearization process.

FIG. 5B is a flowchart illustrating another embodiment of an adaptive self-linearization process. Process 550 shown in the example may be implemented on a low latency adaptive self-linearization module such as 420. During the process, an unknown distorted signal is separated into a reference signal and a target signal (552). A first digital filter is adapted to generate a replica distortion signal that is substantially similar to the distorted component, where the adaptation is based at least in part on the reference signal (554). A second digital filter is configured using coefficients from the adapted first digital filter (556). A second replica distortion signal that is substantially similar to the distorted component using the second digital filter (558).

Figure 10A:
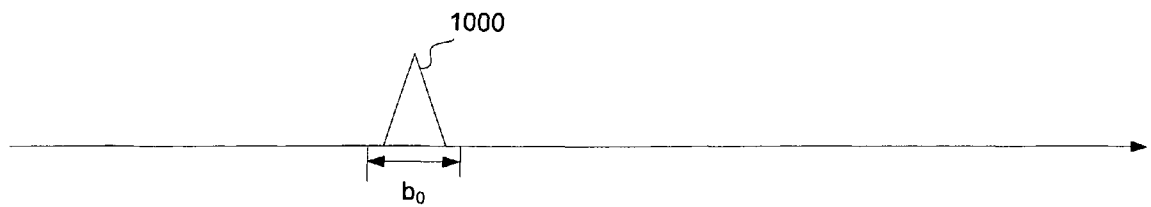
FIGS. 10A-10C are frequency domain signal diagrams illustrating an example of a signal whose reference and target components occupy different frequency bands.
Figure 10B:
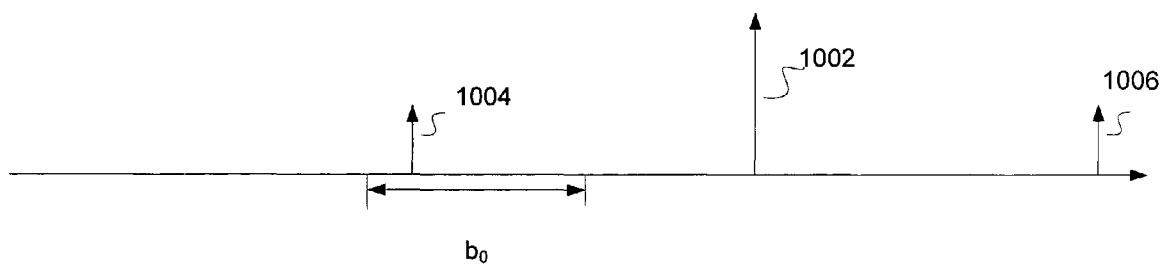
Figure 10C:
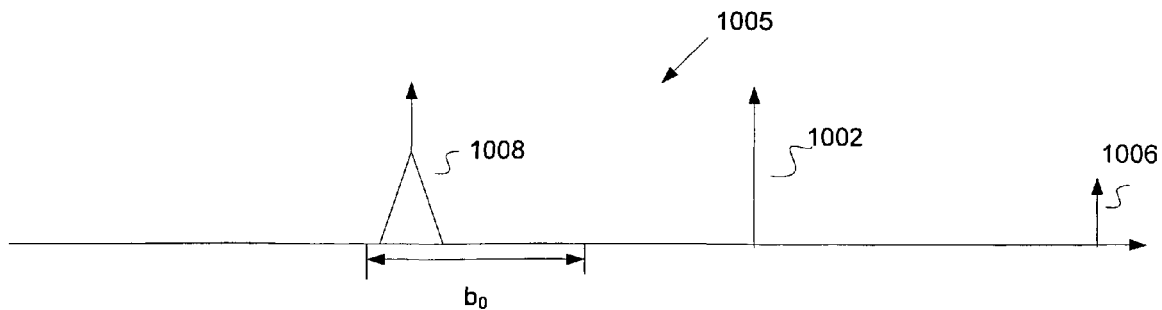

In some embodiments, the reference component and the target component occupy separate frequency bands. FIGS. 10A-10C are frequency domain signal diagrams illustrating an example of a signal whose reference and target components occupy different frequency bands. FIG. 10A shows the ideal, undistorted component 1000, which is limited to frequency band $b_0$. An example of the ideal signal is a radio frequency (RF) signal used in a wireless communication system that employs some form of frequency division, where the signal occupies a specific frequency channel $b_0$. FIG. 10B shows the distortion component, which includes noise signal component 1002 that is outside $b_0$, as well as harmonics of the noise component, including 1004 which falls within frequency channel $b_0$, and 1006 which lies outside $b_0$. An example of noise signal 1002 is another RF signal occupying an adjacent frequency channel relative to signal 1000 and causing distortion in frequency channel $b_0$. FIG. 10C shows the resulting signal 1005. Although the general frequency ranges of the reference and target components are known, the specific characteristics of the signal components are still unknown. Thus, the signal is suitable for processing by any adaptive self-linearization module that implements processes 200 or 500.

An adaptive self-linearization module such as 400 or 420 described above can be used to process the type of signal shown in FIG. 10C. Assuming that the desired signal causes little distortion in its own frequency band and that most of the distortion in the received signal is caused by noise from neighboring frequency channel(s), it is possible to employ adaptive self-linearization modules with less complex circuitry by taking advantage of the fact that the reference and target components reside in different frequency bands. FIG.

11 is a block diagram illustrating another embodiment of an adaptive self-linearization module. In the example shown, separation block 1102 includes a reference signal band-specific filter 1104 and a target signal band-specific filter 1114. In some embodiments, the reference band-specific filter includes a band-stop filter configured to extract from the received signal the noise component and its harmonics outside frequency band $b_0$ and suppress the components within $b_0$, generating the reference component $\hat{y}_n$. The target signal band-specific filter includes a band-pass filter configured to pass components in frequency band $b_0$ and attenuate the rest of the frequencies, generating the target component $\eta_n$.

Based on reference component $\hat{y}_n$, DSP adapts its parameters to generate a replica of the distorted signal, $\hat{\eta}_n$. The adaptation is possible because the reference component and the distorted signal are correlated. $\hat{\eta}_n$ is subtracted from the target component $\eta_n$ to obtain the desired signal $x_n$. A suitable adaptation technique such as LMS or RLS is used to adapt the DSP. Some embodiments base the adaptation on equations (1)-(10).

Referring to FIGS. 10A-10C as an example, the input signal $y_n$ corresponds to signal 1006. The separation block extracts reference component $\hat{y}_n$ which corresponds to components 1002 plus 1006 and target component $\eta_n$, which corresponds to component 1008. In some embodiments, the separation block further limits the bandwidth of reference component extraction such that only 1002 is extracted. Based on $\hat{y}_n$ and its feedback signal $x_n$, the adaptive DSP adapts its transfer function to generate $\hat{\eta}_n$, which approximately corresponds to signal 1004

Figure 12A:
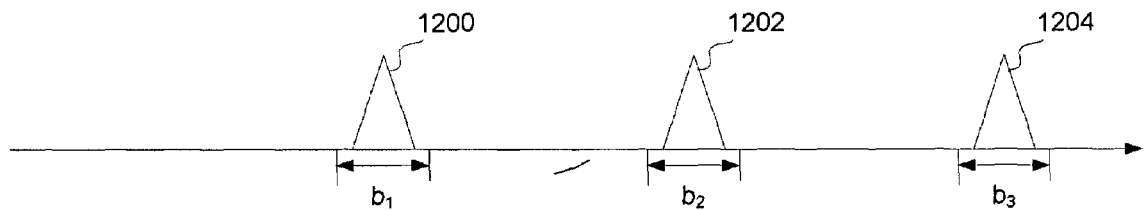
FIGS. 12A-12C are frequency domain signal diagrams illustrating an example where both the reference component and the target component occupy multiple frequency bands.
Figure 12B:
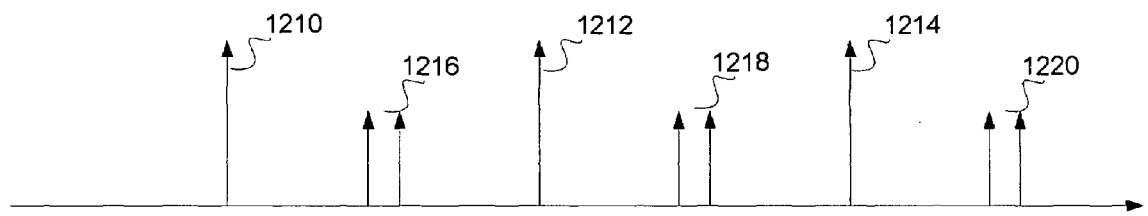
Figure 12C:
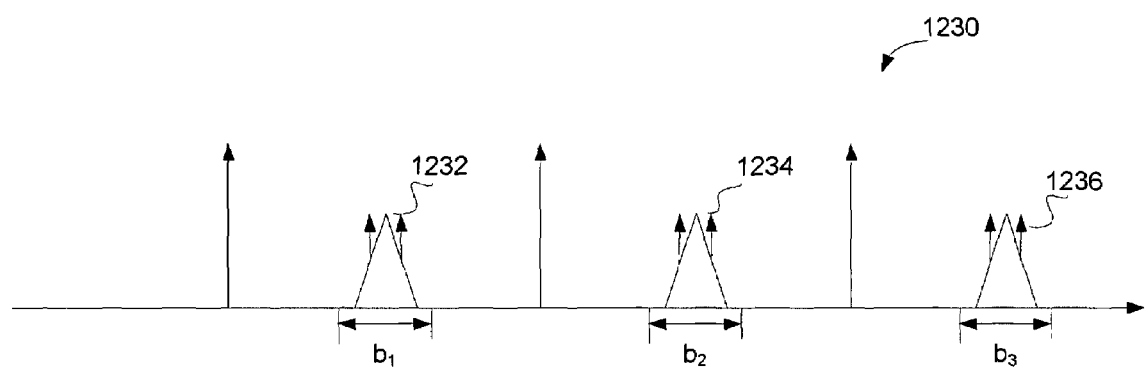

In some embodiments, the offending signals causing distortion in the fundamental frequency band of the desired signal may reside in multiple frequency bands. FIGS. 12A-12C are frequency domain signal diagrams illustrating an example where both the reference component and the target component occupy multiple frequency bands. FIG. 12A shows the undistorted signal components 1200-1204, which occupy separate frequency bands $b_1$-$b_3$. FIG. 12B shows the distorted signal components, which includes several noise components 1210-1214 which reside outside $b_1$-$b_3$, and their harmonics 1216, 1218, and 1220 which reside within $b_1$, $b_2$, and $b_3$ respectively. FIG. 12C shows the resulting distorted signal 1230.

Figure 11:
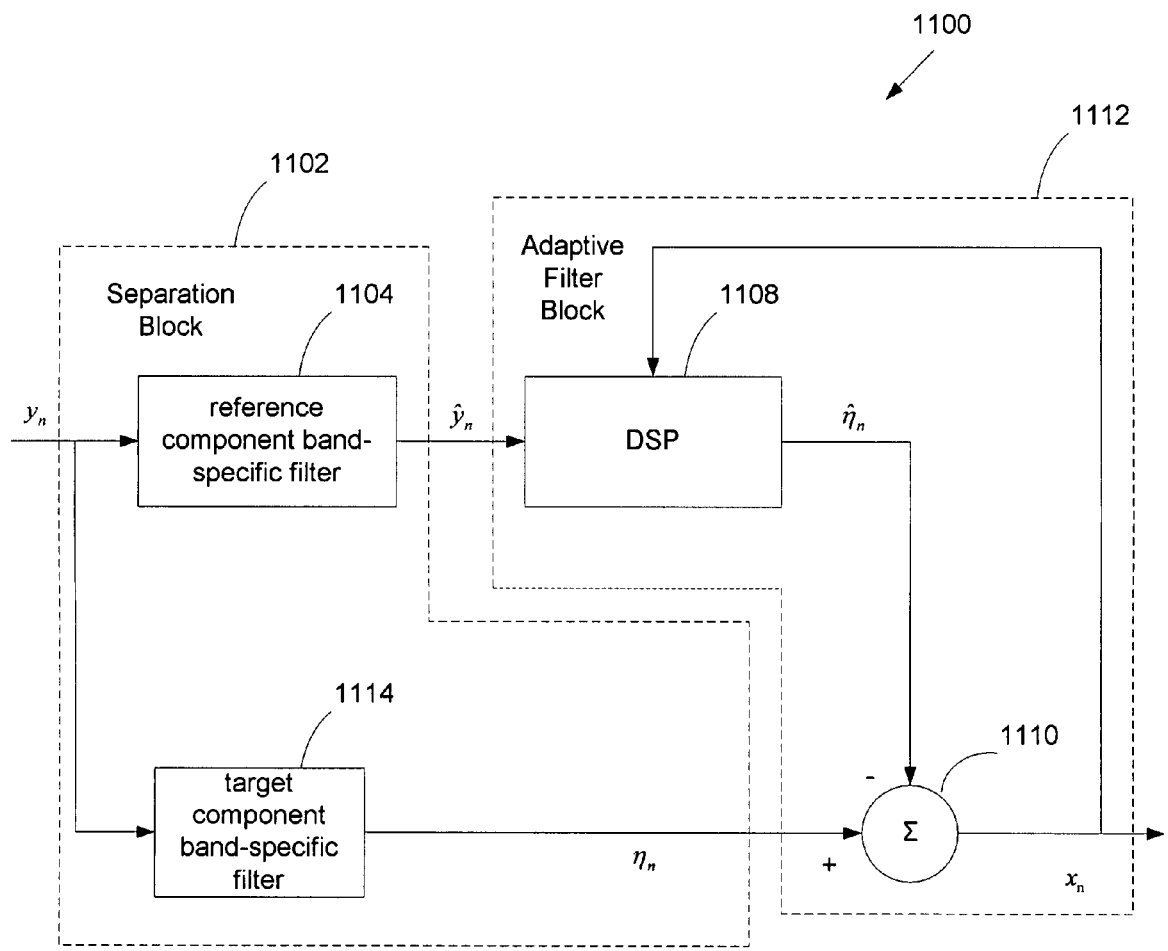
FIG. 11 is a block diagram illustrating another embodiment of an adaptive self-linearization module.
Figure 13:
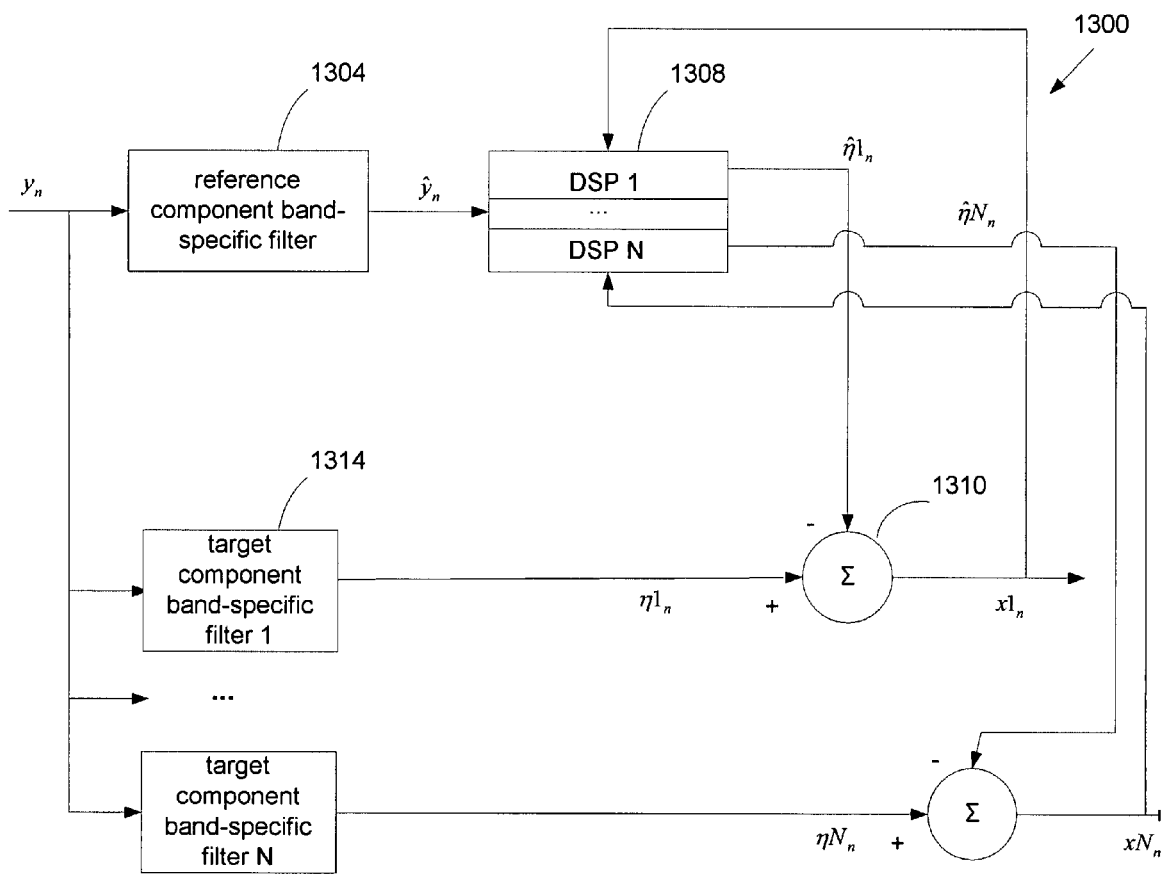
FIG. 13 is a block diagram illustrating an embodiment of an adaptive self-linearization system configured to correct a distorted signal (such as 1230 of FIG. 12C) whose reference components and target components occupy multiple separate frequency bands.

FIG. 13 is a block diagram illustrating an embodiment of an adaptive self-linearization system configured to correct a distorted signal (such as 1230 of FIG. 12C) whose reference components and target components occupy multiple separate frequency bands. In the example shown, system 1300 includes a reference component band-specific filter 1304 for selecting reference signal components $\hat{y}_n$ that cause distortion (e.g., signal components 1210-1214 shown in FIG. 12B). Filter 1304 may be implemented using a plurality of bandpass filters. The system also includes N target component band-specific filters for producing target components $\eta k_n$ (k=1, ..., N) in specific frequency bands. In the example shown in FIG. 12C, N=3, and target components corresponding to 1232, 1234 and 1236 are produced. N DSPs are each adapted based on the reference component and a corresponding feedback signal $xk_n$ to generate distortion components $\hat{\eta} k_n$ (k=1 ..., N). Each $\hat{\eta} k_n$ is subtracted from the target component $\eta_n$ to obtain the desired signal $x_n$. The adaptation technique of each DSP is similar to what was described in FIG. 11.

Adaptive self-linearization of an unknown distorted signal has been described. The techniques described are generally applicable to nonlinear systems. The methods described may be implemented using filters, DSPs, as well as implemented as computer code that operates on general purpose processors.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of signal processing, comprising:
   receiving, at an adaptive self-linearization module, an unknown signal; wherein:
      the unknown signal has a distorted component and an undistorted component; and
      the distorted component and the undistorted component have a nonlinear relationship; and
   separating, at the adaptive self-linearization module, from the unknown signal a reference component and a target component, wherein:
      there is no prior knowledge of characteristics of the unknown signal; and
      the reference component corresponds to an estimate of one or more signal components that cause the distorted component in the unknown signal, and the target component corresponds to a difference between the unknown signal and the reference component.

2. A method as recited in claim 1, wherein separating from the unknown signal a reference component and a target component includes:
   aggregating the unknown signal over a period of time; and
   generating the reference component based on the aggregation.

3. A method as recited in claim 1, wherein the distorted component is substantially caused by the undistorted component.

4. A method as recited in claim 2, wherein separating from the unknown signal a reference component and a target component further includes delaying the unknown signal.

5. A method as recited in claim 2, wherein aggregating the unknown signal over a period of time includes adaptively aggregate the unknown signal.

6. A method as recited in claim 2, wherein aggregating the unknown signal over a period of time includes:
   adapting a plurality of coefficients;
   scaling a plurality of samples of the unknown signal using the plurality of coefficients; and
   aggregating the scaled samples.

7. A method as recited in claim 6, further comprising providing feedback to adapt the plurality of coefficients.

8. A method as recited in claim 7, wherein the feedback includes a difference between a sample of the unknown signal and the aggregated signal.

9. A method as recited in claim 1, further comprising controlling the adaptation by detecting signal strength of the unknown signal.

10. A method as recited in claim 1, further comprising controlling the adaptation, including by adjusting a step size $\mu$.

11. A method as recited in claim 1, further comprising controlling the adaptation, including by adjusting number of filter taps N.

12. A method as recited in claim 1, further comprising based at least in part on the reference signal, adaptively generating a replica distortion signal that is substantially similar to the distorted component, and subtracting the replica distortion signal from the unknown signal to obtain an output signal.

13. A signal processing system comprising:
an input terminal configured to receive an unknown signal;
wherein:
the unknown signal has a distorted component and an undistorted component; and
the distorted component and the undistorted component have a nonlinear relationship; and
a separation block coupled to the input terminal, configured to separate from the unknown signal a reference component and a target component, wherein:
there is no prior knowledge of characteristics of the unknown signal; and
the reference component includes an estimate of one or more signal components that cause the distorted component in the unknown signal, and the target component corresponds to a difference between the unknown signal and the reference component.

14. A system as recited in claim 13, wherein the separation block includes a persistence filter configured to aggregate the unknown signal over a period of time and generate the reference component.

15. A system as recited in claim 14, wherein the separation block further includes a combiner configured to combine a sample of the unknown signal and the aggregate signal.

16. A system as recited in claim 14, wherein the separation block further includes a plurality of coefficient multipliers configured to scale a plurality of samples of the unknown signal with a plurality of coefficients.

17. A system as recited in claim 14, wherein the persistence filter includes a filter having N filter taps.

18. A system as recited in claim 14, wherein the persistence filter is adaptive.

19. A system as recited in claim 18, wherein the persistence filter is adapted by detecting signal strength of the unknown signal.

20. A system as recited in claim 14, wherein the persistence filter is adaptive and includes a filter having N filter taps, and adaptation of the persistence filter is controlled by adjusting N.

21. A system as recited in claim 14, wherein the persistence filter is adaptive and is adapted by adjusting a step size $\mu$.

22. A system as recited in claim 13, further comprising an adaptive filter coupled to the separation block, configured to adaptively generate, based at least in part on the reference signal, a replica distortion signal that is substantially similar to the distorted component, and subtracting the replica distortion signal from the unknown signal to obtain an output signal.

* * * * *